(12) United States Patent
Golner et al.

(10) Patent No.: US 9,362,020 B2
(45) Date of Patent: Jun. 7, 2016

(54) METHOD OF MANUFACTURING A DRY TYPE ELECTRICAL INSULATION

(75) Inventors: Thomas M. Golner, Pewaukee, WI (US); Shirish P. Mehta, Waukesha, WI (US); Padma P. Varanasi, Brookfield, WI (US)

(73) Assignee: Waukesha Electric Systems, Inc., Waukesha, WI (US)

( * ) Notice: Subject to any disclaimer, the term of this patent is extended or adjusted under 35 U.S.C. 154(b) by 245 days.

(21) Appl. No.: 13/155,950

(22) Filed: Jun. 8, 2011

(65) Prior Publication Data

US 2012/0199262 A1 Aug. 9, 2012

Related U.S. Application Data

(60) Provisional application No. 61/441,084, filed on Feb. 9, 2011.

(51) Int. Cl.
| | |
|---|---|
| *H01G 4/16* | (2006.01) |
| *H01G 4/18* | (2006.01) |
| *H01B 3/48* | (2006.01) |
| *H05K 3/46* | (2006.01) |

(52) U.S. Cl.
CPC .. *H01B 3/48* (2013.01); *H01G 4/16* (2013.01); *H01G 4/18* (2013.01); *B32B 2307/204* (2013.01); *H05K 3/4626* (2013.01)

(58) Field of Classification Search
CPC ... H05K 1/038; H05K 1/0386; H05K 1/0393; H05K 3/462; H01G 4/14; H01G 4/16; H01G 4/18; H01G 4/183; B32B 2307/204
USPC .............. 156/166, 167, 180, 181, 296, 308.2, 156/309.6, 312, 583.1
See application file for complete search history.

(56) References Cited

U.S. PATENT DOCUMENTS

| | | | | |
|---|---|---|---|---|
| 3,616,160 | A | * 10/1971 | Wincklhofer et al. | ........ 442/365 |
| 4,009,306 | A | 2/1977 | Yamashita et al. | |
| 4,189,338 | A | * 2/1980 | Ejima et al. | .................. 156/167 |
| 4,235,950 | A | 11/1980 | Miedaner | |
| 4,242,398 | A | * 12/1980 | Segawa et al. | ................ 428/172 |
| 4,334,468 | A | * 6/1982 | Guttinger et al. | ............. 100/311 |
| 5,108,678 | A | * 4/1992 | Hirasaka et al. | .............. 264/113 |
| 6,294,036 | B1 | * 9/2001 | Loubinoux et al. | ........... 156/181 |
| 6,903,916 | B2 | * 6/2005 | Yamazaki et al. | ......... 361/301.4 |
| 6,926,961 | B2 | 8/2005 | Roth | |
| 2009/0253323 | A1 | 10/2009 | Mueller et al. | |
| 2010/0122769 | A1 | 5/2010 | Levit | |
| 2010/0279566 | A1 | * 11/2010 | Yang et al. | ...................... 442/60 |

OTHER PUBLICATIONS

International Search Report of PCT/US2012/24434 filed Feb. 9, 2012, Waukesha Electric Sytems, Inc.

* cited by examiner

*Primary Examiner* — Scott W Dodds
(74) *Attorney, Agent, or Firm* — Baker & Hostetler LLP

(57) ABSTRACT

A method of making a dry type insulation is provided. The method includes combining a base fiber having a first outer surface with a binder material wherein the base fiber has a first melting point and the binder material has a second melting point which is different from the first melting point, heating the base fiber and binder material to a temperature above the second melting point, but below the first melting point using a double-belt press to form a resultant dry type insulation, compressing the base fiber and binder material using the double-belt press to form the resultant dry type insulation and cooling the resultant dry type insulation using the double-belt press.

20 Claims, 6 Drawing Sheets

METHOD OF MANUFACTURING A DRY TYPE ELECTRICAL INSULATION

FIELD OF THE INVENTION

The present invention generally relates to electrical insulators. More particularly, the present invention pertains to a method of manufacturing an insulator.

BACKGROUND OF THE INVENTION

Electrical insulators, or dielectrics, are utilized in a variety of items to separate electrical conductors. Insulators can be dry type or fluid-filled. Fluid filled insulators insulate conductors by using a fluid such as oil. Fluid filled insulators are best suited for high heat applications, such as large industrial complexes. However, fluid filled insulators are costly to manufacture and costly to maintain. Dry type insulators are better suited for ranges of temperatures that are more moderate such as for example, homes and small businesses, and they require less maintenance Typical dry type insulators incorporate staple fibers such as aramid or mica. In order to form a matrix of these fibers, varnish is used. The fibers and varnish are blended together to form the matrix which is then formed into the insulator. This creates more processing steps and does not yield ideal mechanical properties because the varnish does not add strength to the fibers. Further, the additional processing steps add to the cost of manufacturing.

While fiber insulation can be manufactured using a simple single press, using such a press to manufacture binder fiber insulation requires additional post-processing to develop enough mechanical stability for use in the mechanical support structure for a power transformer. When utilizing a single press to manufacture dry type insulation, heat and pressure are used to form the insulation. At the end of the process the insulation is removed from the press and it cools. When the insulation cools and is no longer under pressure, it relaxes and loses stability and strength. In essence, the insulation "springs back." Additional post-processing can be performed to remediate this occurrence but can increase cost and make this a less desirable type of insulation for use in a power transformer or any other suitable application.

Accordingly, it is desirable to provide a processing method for a dry type insulator that can retain its strength and stability even after the processing steps have been completed.

SUMMARY OF THE INVENTION

The foregoing needs are met, to a great extent, by the present invention, wherein in one respect, a manufacturing method is provided that allows dry type insulation to be formed that retains its strength and stability after the processing steps have been completed.

In one embodiment a method of manufacturing a dry type electrical insulation is provided that includes combining a base fiber having a first outer surface with a binder material wherein the base fiber has a first melting point and the binder material has a second melting point which is different from the first melting point, heating the base fiber and binder material to a temperature above the second melting point, but below the first melting point using a double-belt press to form a resultant dry type insulation, compressing the base fiber and binder material using the double-belt press to form the resultant dry type insulation and cooling the resultant dry type insulation using the double-belt press.

In another embodiment, a method of making a dry type insulation prepared by a process includes combining a base fiber having a first outer surface with a solid binder material wherein the base fiber has a first melting temperature and the solid binder fiber has a second melting temperature which is different from the first melting temperature, heating the base fiber and solid binder material to a temperature above the second melting temperature using a double-belt press to form a resultant dry type insulation, compressing the base fiber and solid binder material using the double-belt press to form the resultant dry type insulation, and cooling the resultant dry type insulation using the double-belt press.

In a third embodiment, a means for forming a dry type insulation includes a means for applying pressure to base fibers co-extruded with binder material, wherein the base fibers have a first melting point and the binder material has a second melting point lower than the first melting point, a first means for providing a first temperature above the second melting point, and a second means for providing a second temperature below the second melting point.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
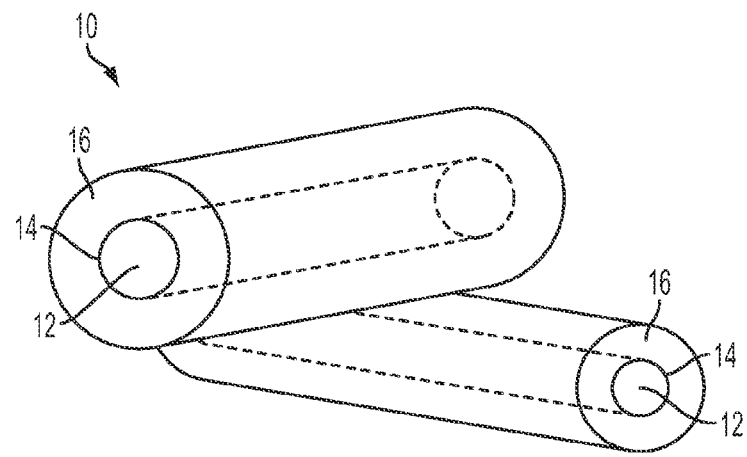
FIG. 1 is a perspective view of components for dry type electrical insulation in accordance with an embodiment of the present invention.

Embodiments of the present invention will now be described with reference to the drawing figures, in which like reference numerals refer to like parts throughout. FIG. 1 is a perspective view of components for dry type electrical insulation in accordance with an embodiment of the present invention. In particular, FIG. 1 shows two composite fibers 10, where the composite fiber 10 includes a base fiber 12 having an outer surface 14. The outer surface 14 is coated with a sheath of a binder material 16.

The base fiber 12 can be made from a staple fiber such as wool, hemp, raw cotton, flax, aramid, mica or other natural material. The base fiber 12 can also be made from a thermoplastic such as polyethylene terephthalate (PET), polyphenylene sulphide (PPS), polyetherimide (PEI), polyethylene napthalate (PEN), polyethersulfone (PES) or polybutylene terephthalate (PBT) and/or combinations thereof. Generally, the base fiber 12 is formed of a material having a high melting point.

The binder material 16 is preferably an amorphous or crystalline thermoplastic material. More particularly, the binder material 16 can be formed from at least one of a copolymer of polyethylene terephthalate (CoPET), polybutylene terephthalate (PBT), or undrawn polyphenylene sulphide (PPS) and/or combinations thereof. The melting point of the binder material 16 is lower than the melting point of the base fiber 12. At typical processing temperatures of about 220-240° C., or about 20° C. above the melting point of the binder material 16, the binder material 16 melts and adheres to other composite fibers 10, forming a strong matrix with better mechanical properties than conventional dry type insulation materials. Alternately, the binder material 16 can be any material suitable for the operating temperature and mechanical strength requirement based on the device to be insulated.

For instance, if the binder material melts at 220° C. a suitable base fiber 12 would be one that would not melt until at least 250° C. The operating temperature of the insulation would be lower than the melting point of either the binder material or the base fibers so that the matrix does not melt during operation, for example, in the range of 150-200° C. Such a material could be suitable for an application in a device that has approximately 200° C. continuous operation. Dry type insulation of the prior art has not been able to accommodate such a high temperature range. Thus, embodiments of the present invention allow for dry type insulation to be utilized at a higher temperature range than would otherwise be possible.

Preferably, the binder material 16 can be compressible to a high density material on the order of about 0.50 to about 1.10 g/cc, and have the ability to bond the base fibers 12, while maintaining good dielectric properties. Additionally, within this range, the mechanical properties are strong enough for most applications within the dry type electrical apparatus. Embodiments of this invention will also allow the binder material 16 to be chosen such that the processing temperature will be above the anticipated operating temperature. Because the binder material 16 is incorporated directly on the surface of the base fiber 12 and is co-extruded with the base fiber 12, there is no requirement for impregnation with a varnish system.

In an embodiment of the present invention, it is possible to vary the amount of base fibers 12 that include the binder material 16. For example, at 100% loading, all of the base fibers 12 are co-extruded with the binder material 16. During processing, the binder material 16 melts and adheres to other composite fibers 10 to form a matrix. When 100% of the fibers in the matrix include the binder material 16, (or there is a 100% loading, referring to the percentage of base fibers 12 that are coated with the binder material 16), a very strong, rigid matrix is formed. However, this can be very costly. Further, some applications do not require such rigidity and strength. It has also been found that at 100% loading, the porosity of the completed matrix is reduced, which can be undesirable in certain applications.

As another example, it may be desirable to incorporate only 50% of base fibers that are co-extruded with binder material 16. The other 50% of the base fibers 12 would be left bare. In this instance, raising the processing temperatures above the melting point of the binder material 16 ensures that the binder material 16 melts and binds the base fibers 12 of the coated and uncoated base fibers 12. The binder material 16 on half of the base fibers 12 will allow all of the fibers to adhere to each other, acting as binder for the entire matrix. Thus, a 50% loading, referring to the percentage of the coated base fibers 12, still yields strength but lowers costs. There is also some amount of porosity.

Therefore, the load of the base fibers, or the percentage of the base fibers 12 coated with binder material 16, can be varied, depending on the mechanical strengths and costs, as desired. In embodiments of the present invention, 50-100% loading is preferable. Some instances have shown that 70-80% loading is acceptable for most normal applications, including ranges and limits there between. Consideration on the percentage of loading is also based on the type of base fiber 12 that is used. A traditionally weaker base fiber may require greater loading, whereas a stronger base fiber may require less loading.

Figure 2:
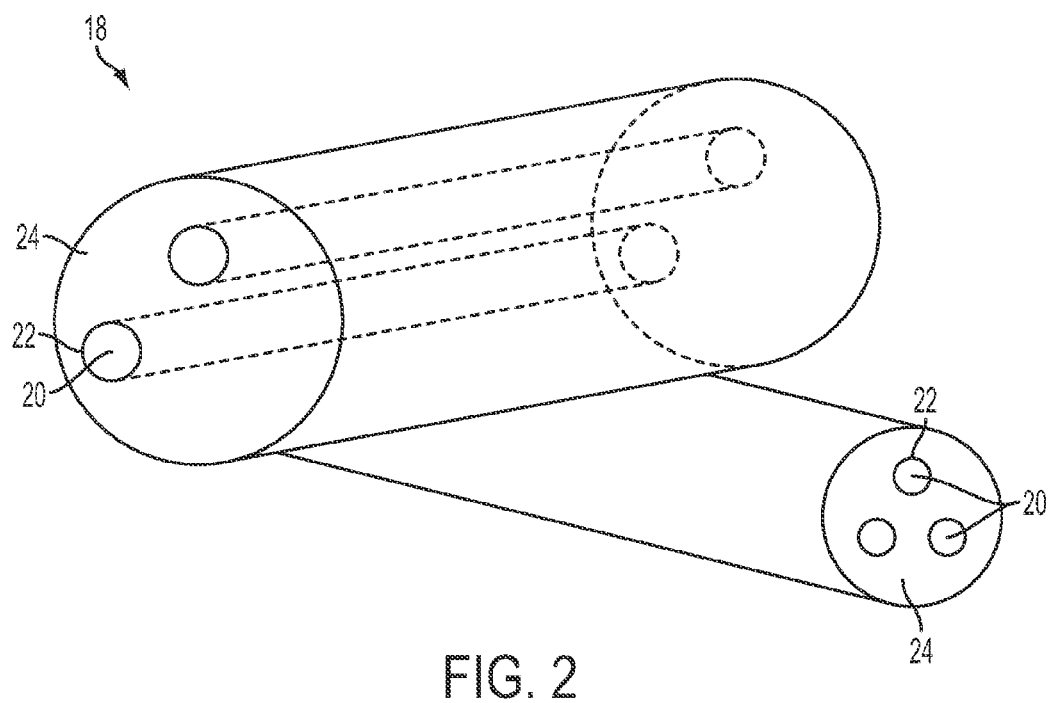
FIG. 2 is a perspective view of components for dry type electrical insulation in accordance with an embodiment of the present invention.

FIG. 2 illustrates a perspective view of components for dry type electrical insulation in accordance with another embodiment of the present invention. As shown in FIG. 2, a composite fiber 18 includes numerous base fibers 20 having outer surfaces 22. The outer surfaces 22 are all covered with a single coating of a binder material 24. The binder material 24 can be co-extruded over the outer surfaces 22 of the base fibers 20 forming a multiple core structure of base fibers 20. These two composite fibers 18 can then be bonded together using heat and pressure to form a matrix of the dry type insulation. The number of base fibers 20 that are co-extruded together with the binder material 24 can be varied as desired.

Figure 3:
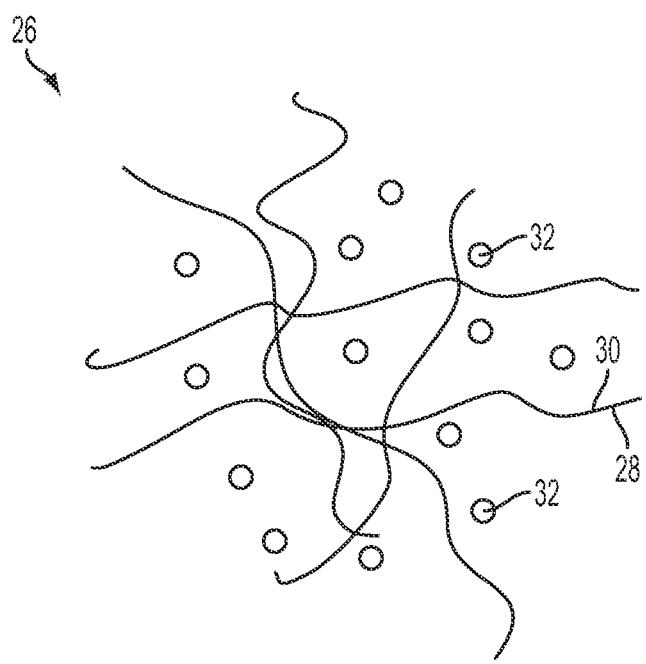
FIG. 3 is a perspective view of components for dry type electrical insulation in accordance with an embodiment of the present invention.

FIG. 3 is a perspective view of components for dry type electrical insulation in accordance with yet another embodiment of the present invention. The composite structure 26 of FIG. 3 includes base fibers 28 having outer surfaces 30. Particles of binder material 32, in the form of a powder are incorporated during processing. The base fibers 28 and the binder material powder 32 are air blended and heated to a temperature above the melting point of the binder material 32, allowing the binder material 32 to melt and adhere to the base fibers 28. This embodiment allows for a high amount of porosity.

Figure 4:
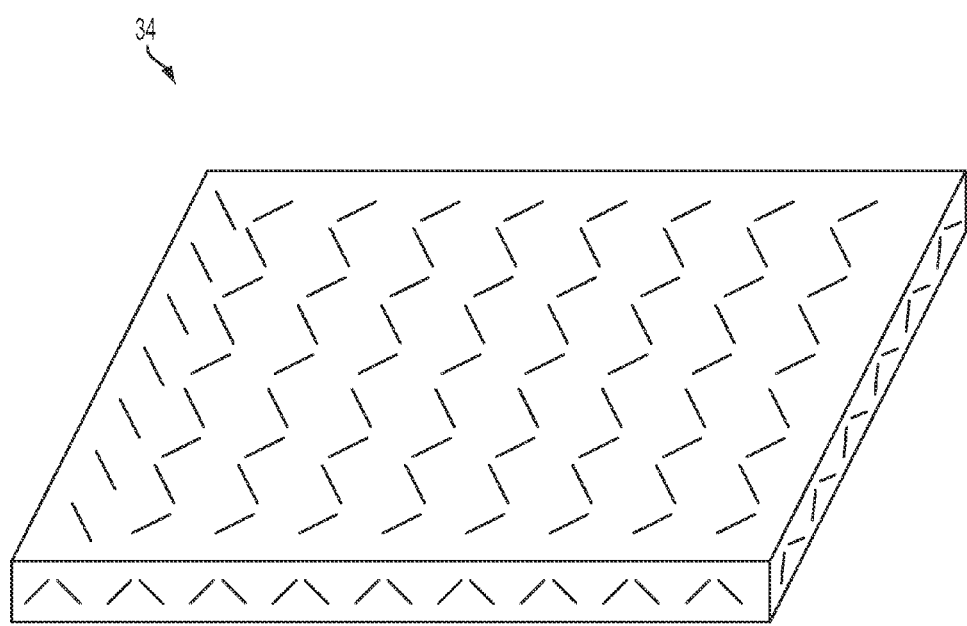
FIG. 4 is a perspective view of a matrix formed using any of the embodiments as shown in FIGS. 1, 2 and/or 3.

FIG. 4 is a perspective view of a matrix 34 formed using any of the embodiments as shown in FIGS. 1, 2 and/or 3. The diameter of each base fiber is typically on the order of microns and the length of each base fiber is typically on the order of millimeters or centimeters. As such, thousands or even millions of such composite fibers 10 are bound together to form the dry type electrical insulation matrix 34 described herein.

Figure 5:
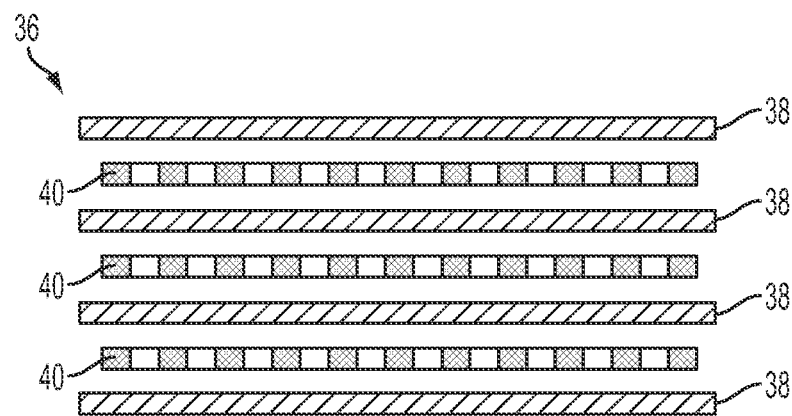
FIG. 5 is a cross sectional view of dry type insulation layered with a conductor in accordance an embodiment of the present invention.
Figure 6:
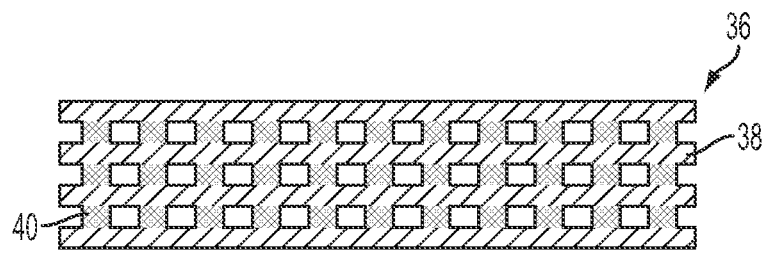
FIG. 6 is a cross sectional view of dry type insulation layered with a conductor and treated with heat and pressure according to the embodiment of FIG. 4.

FIGS. 5 and 6 illustrate processing steps during formation of a laminate 36 of an insulator and a conductor. As shown in FIG. 5, sheets of conductor material 38 can be layered with dry type insulation 40. The insulation 40 is formed as discussed with respect to FIGS. 1, 2, and/or 3. Heat and pressure are applied to press the conductor 38 to the insulation 40 to form the finished laminate 36. FIG. 6 illustrates such a formed laminate 36 after heat and pressure are applied, bonding the insulation 40 to the conductor 38. Alternately, the material can be formed or bonded in place in the device to be insulated or pre-formed and wrapped around or placed in the device to be insulated.

For example, the layers can be placed in the device to be insulated and then heat can be applied, melting the layers together. In an embodiment of the present invention, the layers of insulation 40 are longer than the layers of the conductor 38. This allows for the insulation 40 to prevent contact of the layers of conductor 38 so that the laminate 36 does not short out. The longer length of the layers of insulation 40 also form a cap over the laminate 36. The sizes, lengths, widths, of the composite fibers, the particulates and the laminates can all be varied as desired.

Figure 7:
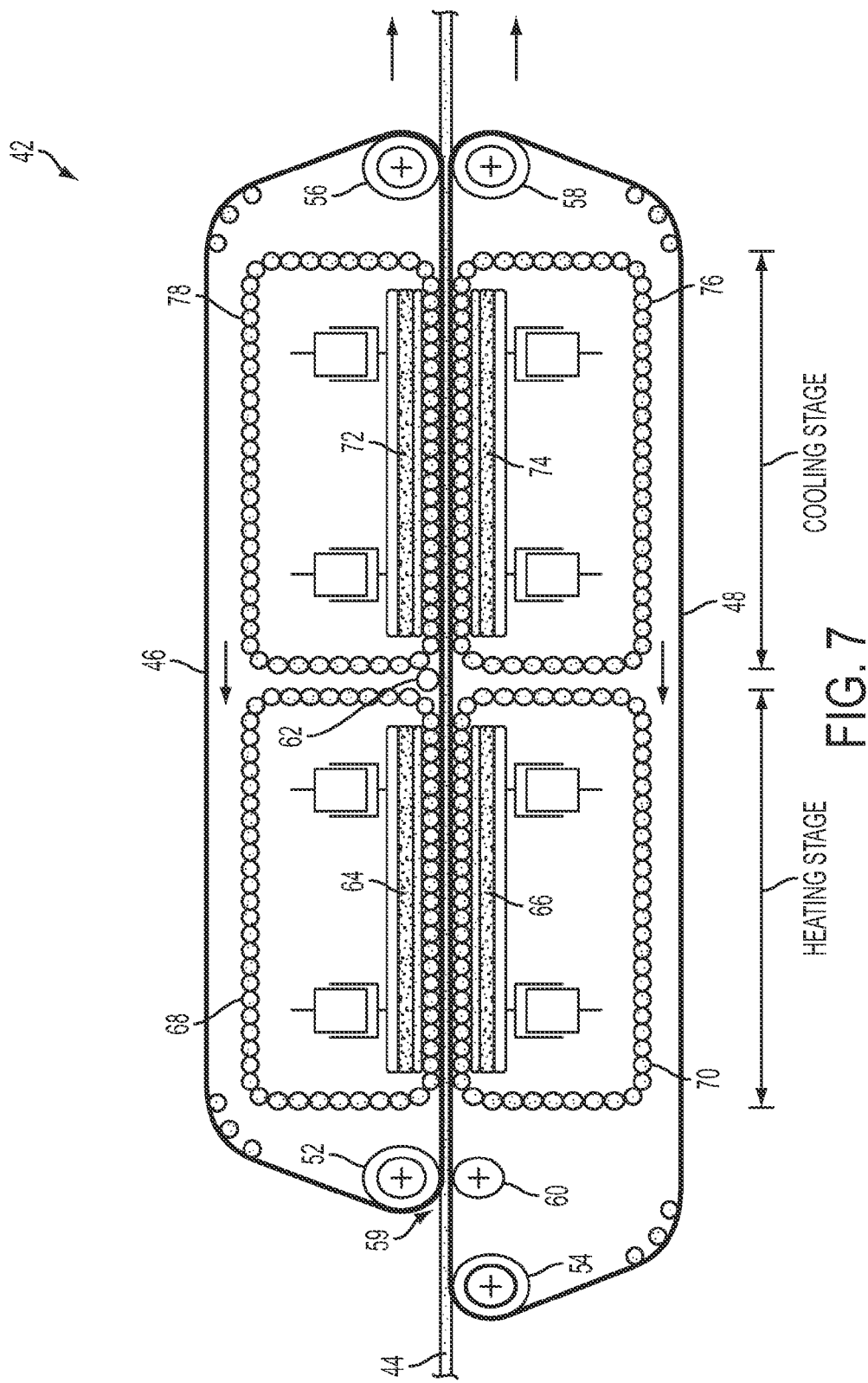
FIG. 7 is a cross sectional view of a double-belt press used to process binder fibers for use in electrical insulation, in accordance with an embodiment of the present invention.

FIG. 7 illustrates a cross sectional view of a double-belt press, used to manufacture the dry type insulation as described herein. By way of example, the double-belt press 42 illustrated in FIG. 7 includes a feed tray 44, and two endless belts 46 and 48 that form a nip 50 there between. The two belts 46 and 48 revolve around rollers 52, 54, 56, 58, and 60. Rollers 52, 54, 56, 58, and 60 apply varying degrees of pressure to the material moving through the nip 50. Generally, roller 60 applies more pressure than the other rollers. This additional pressure allows for the fibers to be oriented toward the direction of processing and also increases the density of the layers. Compressing the material at this juncture, before it has been heated allows it to be heated in that compressed form, allowing for a more stable finished product that retains its density and compression. For example, rollers 52, 54, 56, and 58 can apply approximately 200 psi of pressure, while roller 60 applies approximately 500 psi of pressure. However, any suitable pressure to compress the composite fibers 10 can be used.

FIG. 7 further illustrates press plates 64, 66, 72, and 74. The press plates 64, 66, 72, and 74 can be heated such that the press plates transfer heat to the composite fibers 10. Roller chains 68, 70, 76, and 78 move with the belts 46 and 48 in order to lower friction between the belts and the press plates.

Additionally, a nip roller 62 can be included in order to develop a stable matrix that is held under tension as it proceeds through the manufacturing steps. The nip roller 62 does not apply any pressure to the matrix being formed through the double-belt press 42. However, the nip roller 62 provides tension and prevents the matrix from relaxing as it goes from the heating stage to the cooling stage, described in further detail below. Further, the nip roller 62 allows the composite fibers 10 to orient themselves axially, along the direction of the process.

As shown in FIG. 7, the double belt press 42 includes two stages, a stage for heating and a stage for cooling. The components of the double belt press 42 that account for the heating stage are press plates 64, 66 and roller chains 68, 70. The components of the double belt press 42 that account for the cooling stage are press plates 72, 74 and roller chains 76, 78. The press plates 64, 66, 72, and 74 can be configured to apply heat at the same temperature or different temperatures.

In an embodiment of the present invention the press plates 64, 66 of the heating stage, apply heat at a higher temperature than the press plates 72, 74 of the cooling stage. For example, press plates 64 and 66 can apply heat at 250° C. while press plates 72 and 74 apply heat at 65° C. Such a temperature differential between the press plates of the heating stage and cooling stage, allows the dry type insulation matrix that is manufactured, to undergo gradual cooling, while held under tension and pressure. Such a gradual cooling, while under pressure prevents the matrix from relaxing or "springing back" as has been seen in the conventional art. In addition, heating and cooling the matrix while under going continuous pressure provides for a more uniform matrix, better compression properties, and better stability. It should be noted that the temperature of both press plates is kept below the melting point temperature of the base fiber.

In operation, the composite fibers 10 can be placed on the feed tray 44 and passed through the two belts 46, 48. The composite fibers 10 are placed there with the percent loading that is desired, as previously discussed. Thus, at 70% loading, 70% of the fibers placed at the feed tray 44 will be co-extruded with the binder material, while 30% of the material will be bare.

The fibers 10 then are fed through the double belt press 42 between the nip roller 50 and the roller 52 and enter the heating stage. While on the feed tray 44, press plates 64 and 66 heat the fibers 10 to a temperature higher than the melting point of the binder material, but lower than the melting point of the base fibers. During the heating stage, the binder material melts and combines with all of the base fibers to form the matrix. The fibers, now in the form of the matrix proceed to the nip roller 62 where the matrix is stretched and held in tension.

Next, the matrix is fed through the cooling stage between press plates 72, 74, where a gradual cooling of the matrix occurs. The temperatures here range approximately 50-60° C. below the melting point of the binder. The matrix is held under pressure as it exits the double belt press 42 between rollers 56, 58. At the exit, the matrix cools further to ambient temperature and undergoes ambient pressure, resulting in a gradual cooling that provides for a stable, strong product that is uniform throughout.

Although not shown on FIG. 7, there may be instances where it is desirable to pre-heat the fibers before feeding them into the double belt press 42. Pre-heating the fibers to a temperature near the temperature at the heating stage, such as for example, about 5-60° C. below the melting temperature of the binder, can allow for a gradual warm-up of the fibers. Such a gradual warm up allows for a lower temperature differential as the fibers enter the heating stage. It has been found that in instances where the fibers are pre-heated, the resulting matrix has better compression properties and is more stable and uniform through the depth of the matrix. However, when the matrix has not been pre-heated, the matrix has been found to have more flexure. Thus, pre-heating the fibers before processing them using the double belt press is optional, depending on the characteristics desired: flexure or compression.

Figure 8:
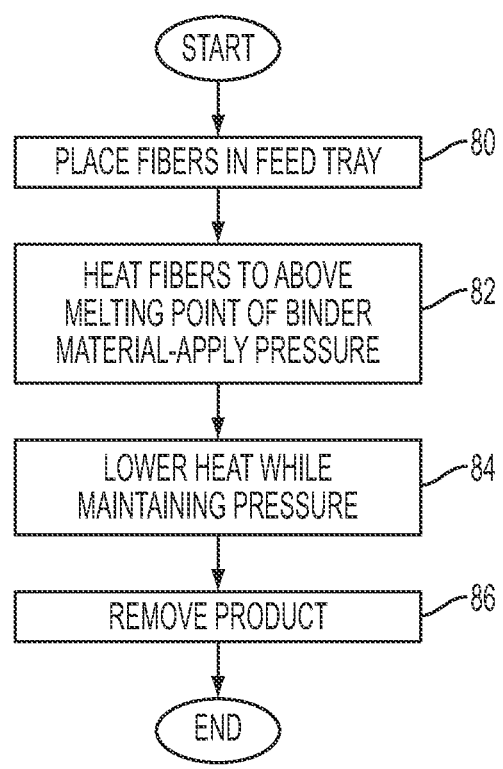
FIG. 8 is a flow diagram of a method for fabricating the dry type insulation using a double-belt press according to an embodiment of the present invention.

FIG. 8 is a flow diagram of a method for fabricating the dry type insulation according to an embodiment of the present invention using a double-belt press. Step 80 includes placing on the feed tray those base fibers that are co-extruded with the binder material and those base fibers that are not, according to the percent loading that is desired. The base fiber can have a first melting point and the binder material can have a second melting point which is lower than the first melting point. Step 82 includes heating the base fiber and binder material to a temperature above the second melting point, but below the first melting point using a double-belt press. Step 82 also includes compressing the base fiber and binder material using the double-belt press to form a matrix. Additionally, the method can include layering the base fiber and binder material between layers of a sheet conductor to form a laminate of the sheet conductor. The compressing and heating of step 82 can further include compressing and heating with the double-belt press, such that the resulting dry type electrical insulation has a density of between approximately 0.5 g/cm3 and approximately 1.10 g/cm3.

Step 84 includes cooling the resultant dry type insulation matrix using the double-belt press. The cooling step can be performed after the steps of heating and compressing by lowering the temperature to a temperature below the melting point of the binder material, approaching room temperature. Lastly, the method includes step 86 where the formed matrix is removed into ambient pressure and temperature.

In an embodiment of the present invention, any number of layers of insulation and conductor may be formed. The thickness and dimensions of the layers may be varied as desired, as well as the thickness and dimensions of the formed matrix. The layers can also be placed in the device to be insulated and heated in place.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A method of manufacturing a dry type electrical insulation laminate, comprising:
    co-extruding base fibers having a first outer surface together with a binder material such that the binder material is coated on the base fibers and the binder material forms a sheath over the surface of the base fibers, wherein the base fibers have a first melting point and the binder material has a second melting point which is different from the first melting point;
    heating the base fibers and binder material to a temperature above the second melting point, but below the first melting point using a double-belt press that includes at least one roller chain to form a resultant dry type insulation;
    compressing the base fibers and binder material using the double-belt press to join the binder material of the base fibers to form the resultant dry type insulation;
    cooling the resultant dry type insulation using the double-belt press;
    providing a sheet of conductor material having a length shorter than a length of the resultant dry type insulation; and
    layering the resultant dry type insulation between layers of the sheet of conductor to form a laminate; and
    heating the laminate that includes the resultant dry type insulation and the layers of the sheet of conductor while applying pressure to the resultant dry type insulation and the layers of the sheet of conductor to bond the resultant dry type insulation to the layers of the sheet of conductor,
    wherein the base fibers comprise staple fibers which are stable at a temperature needed to melt the binder material.

2. The method of claim 1, wherein the base fibers comprise at least one of polyethylene terephthalate (PET), polyphenylene sulphide (PPS), polyetherimide (PEI), polyethylene napthalate (PEN), polybutylene terephthalate (PBT), polyethersulfone (PES) and/or combinations thereof.

3. The method of claim 1, wherein the binder material comprises at least one of an amorphous and a crystalline thermoplastic material.

4. The method of claim 1, wherein the binder material comprises at least one of a copolymer of polyethylene terephthalate (CoPET), polybutylene terephthalate (PBT), undrawn polyphenylene sulphide (PPS) and/or combinations thereof.

5. The method of claim 1, wherein the compressing and heating steps result in the resultant dry type insulation comprising a density of between approximately 0.5 g/cm$^3$ and approximately 1.10 g/cm$^3$.

6. The method of claim 1, wherein the step of cooling is performed by the double-belt press after the step of compressing and heating.

7. The method of claim 1, wherein the temperature above the second melting temperature, but below the first melting temperature is in the range of approximately 200° C. to 300° C.

8. The method of claim 1, wherein compressing the base fibers and binder material using the double-belt press further comprises using pressure of approximately 200 psi.

9. The method of claim 8, wherein compressing the base fibers and binder material using the double-belt press further comprises a period of a higher pressure of approximately 500 psi.

10. The method of claim 1, wherein the base fibers and binder material are preheated prior to introduction into the double-belt press.

11. The method of claim 1, further comprising feeding the base fibers and binder material to the double-belt press from a feeding tray after the co-extruding and prior to heating the base fibers.

12. The method of claim 1 wherein bare base fibers are incorporated with the base fibers coated with binder material prior to heating and compressing to form the resultant dry type insulation.

13. A method of manufacturing a dry type insulation laminate comprising dry type insulation comprising:
    co-extruding base fibers having a first outer surface with a binder material such that the binder material is coated on the base fibers and the binder material forms a sheath over the surface of the base fibers, wherein the base fibers have a first melting temperature and the binder material has a second melting temperature which is different from the first melting temperature;
    heating the base fibers and binder material to a temperature above the second melting temperature using a double-belt press that includes at least one roller chain to form a resultant dry type insulation;
    compressing the base fibers and binder material using the double-belt press to join the binder material of the base fibers to form the resultant dry type insulation;
    cooling the resultant dry type insulation using the double-belt press;
    providing a sheet of conductor material having a length shorter than a length of the resultant dry type insulation; and
    layering the resultant dry type insulation between layers of the sheet of conductor to form a laminate; and
    heating the laminate that includes the resultant dry type insulation and the layers of the sheet of conductor while applying pressure to the resultant dry type insulation and the layers of the sheet of conductor to bond the resultant dry type insulation to the layers of the sheet of conductor.

14. The method of claim 13, wherein the double-belt press comprises a plurality of roller chains.

15. The method of claim 13, wherein the double-belt press comprises a plurality of roller chains and heated press plates associated with heating the base fibers.

16. The method of claim 13, wherein the double-belt press comprises a plurality of roller chains associated with cooling the base fibers.

17. The method of claim 13, wherein the double-belt press comprises a plurality of roller chains associated with heating the base fibers, and wherein the double-belt press comprises a plurality of roller chains associated with cooling the base fibers.

18. The method of claim 13, further comprising feeding the base fibers and binder material to the double-belt press from a feeding tray after the co-extruding and prior to heating the base fibers.

19. The method of claim 13 wherein bare base fibers are incorporated with the base fibers coated with binder material prior to heating and compressing to form the resultant dry type insulation.

20. A method of manufacturing a dry type electrical insulation laminate, comprising:
   combining base fibers having a first outer surface with a binder material wherein the base fibers have a first melting point and the binder material has a second melting point which is different from the first melting point;
   heating the base fibers and binder material to a temperature above the second melting point, but below the first melting point using a double-belt press to form a resultant dry type insulation;
   compressing the base fibers and binder material using the double-belt press to join the binder material of the base fibers to form the resultant dry type insulation;
   cooling the resultant dry type insulation using the double-belt press; and
   layering the resultant dry type insulation between layers of a sheet conductor to form a laminate,
   wherein compressing the base fibers and binder material using the double-belt press further comprises using pressure of approximately 200 psi; and
   wherein compressing the base fibers and binder material using the double-belt press further comprises a period of a higher pressure of approximately 500 psi.

* * * * *